United States Patent [19]

Bobbio et al.

[11] Patent Number: 4,738,761
[45] Date of Patent: Apr. 19, 1988

[54] SHARED CURRENT LOOP, MULTIPLE FIELD APPARATUS AND PROCESS FOR PLASMA PROCESSING

[75] Inventors: Stephen M. Bobbio, Wake Forest; Yueh-Se Ho, Raleigh, both of N.C.

[73] Assignee: Microelectronics Center of North Carolina, Research Triangle Park, N.C.

[21] Appl. No.: 916,007

[22] Filed: Oct. 6, 1986

[51] Int. Cl.⁴ .............................................. C23C 14/34
[52] U.S. Cl. .............................. 204/192.12; 204/298
[58] Field of Search .............. 204/192.1, 192.12, 298, 204/164; 156/345

[56] References Cited

U.S. PATENT DOCUMENTS

| | | | |
|---|---|---|---|
| 3,627,663 | 12/1971 | Davidse et al. | 204/298 X |
| 3,860,507 | 1/1975 | Vossen, Jr. | 204/298 X |
| 4,155,825 | 5/1979 | Fournier | 204/298 X |
| 4,198,283 | 4/1980 | Class et al. | 204/298 |
| 4,252,626 | 2/1981 | Wright et al. | 204/298 X |
| 4,349,409 | 9/1982 | Shibayama et al. | 204/298 X |
| 4,351,714 | 9/1982 | Kuriyama | 204/298 |
| 4,352,725 | 10/1982 | Tsukada | 204/298 X |
| 4,361,472 | 11/1982 | Morrison, Jr. | 204/298 X |
| 4,361,749 | 11/1982 | Lord | 204/298 X |
| 4,362,611 | 12/1982 | Logan et al. | 204/298 |
| 4,392,932 | 7/1983 | Hara | 204/298 X |
| 4,399,016 | 8/1983 | Tsukada et al. | 204/298 X |
| 4,417,968 | 11/1983 | McKelvey | 204/298 X |
| 4,422,896 | 12/1983 | Class et al. | 156/643 |
| 4,426,267 | 1/1984 | Munz et al. | 204/298 X |
| 4,427,524 | 1/1984 | Crombeen et al. | 204/298 |
| 4,428,816 | 1/1984 | Class et al. | 204/298 |
| 4,434,038 | 2/1984 | Morrison, Jr. | 204/298 X |
| 4,464,223 | 8/1984 | Gorin | 204/298 X |
| 4,472,259 | 9/1984 | Class et al. | 204/298 |
| 4,525,262 | 6/1985 | Class et al. | 204/192.12 |
| 4,572,759 | 2/1986 | Benzing | 204/298 X |
| 4,581,118 | 4/1986 | Class et al. | 204/298 |

OTHER PUBLICATIONS

MCNC Technical Bulletin, Jul./Aug. 1986, pp. 2,8; "Plasma Etching", S. M. Bobbio and Y. S. Ho.

Primary Examiner—John F. Niebling
Assistant Examiner—Nam X. Nguyen
Attorney, Agent, or Firm—Bell, Seltzer, Park & Gibson

[57] ABSTRACT

A shared current loop, multiple field apparatus and process for magnetron gas discharge processing is disclosed. The apparatus includes an evacuable chamber for containing a reactant gas. A multi-part cathode associated with a current loop generates multiple, independent electrical fields. The cathode comprises a first cathode portion for generating a first electric field that forms a gas discharge including ions. The second cathode portion generates a second, independent electric field. The second electric field extracts ions from the gas discharge, and may also control the energy with which the extracted ions strike an item to be processed. Each cathode portion is electrically insulated from the other and may be connected to a separate power source.

40 Claims, 2 Drawing Sheets

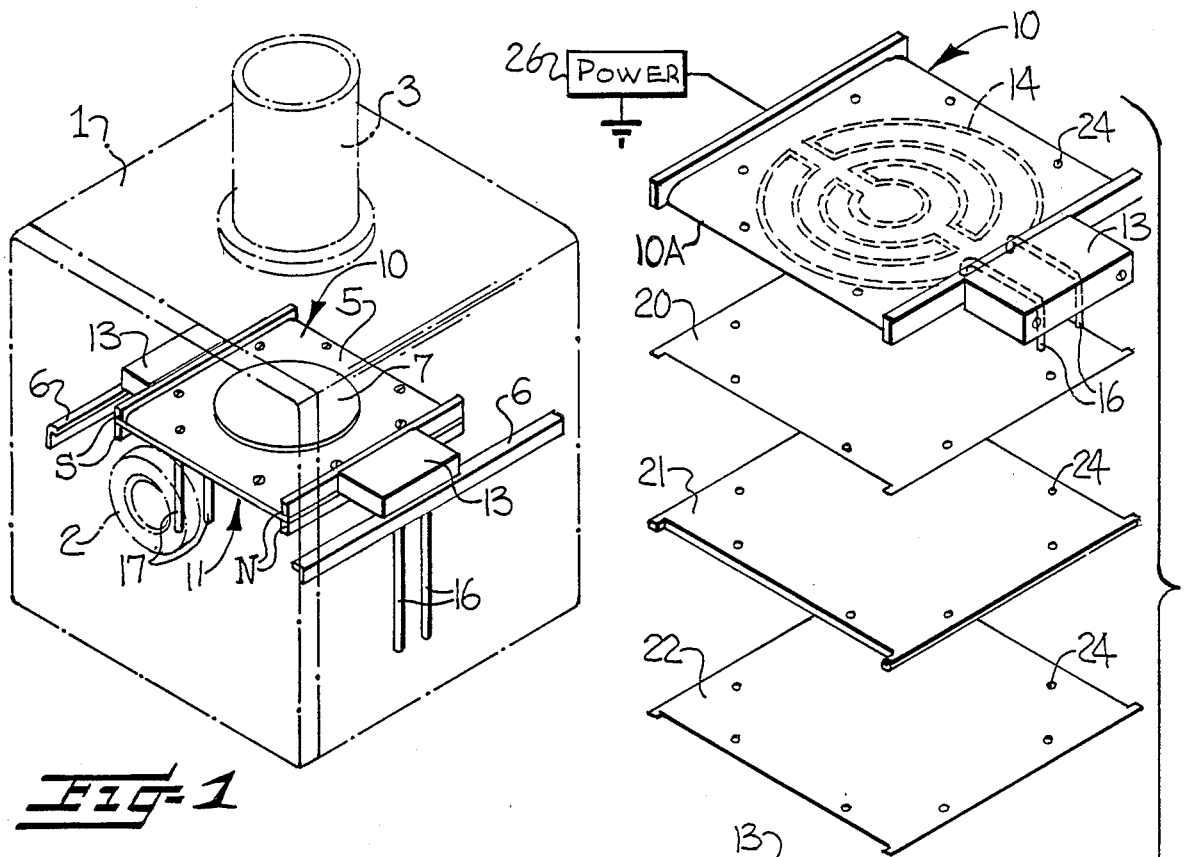
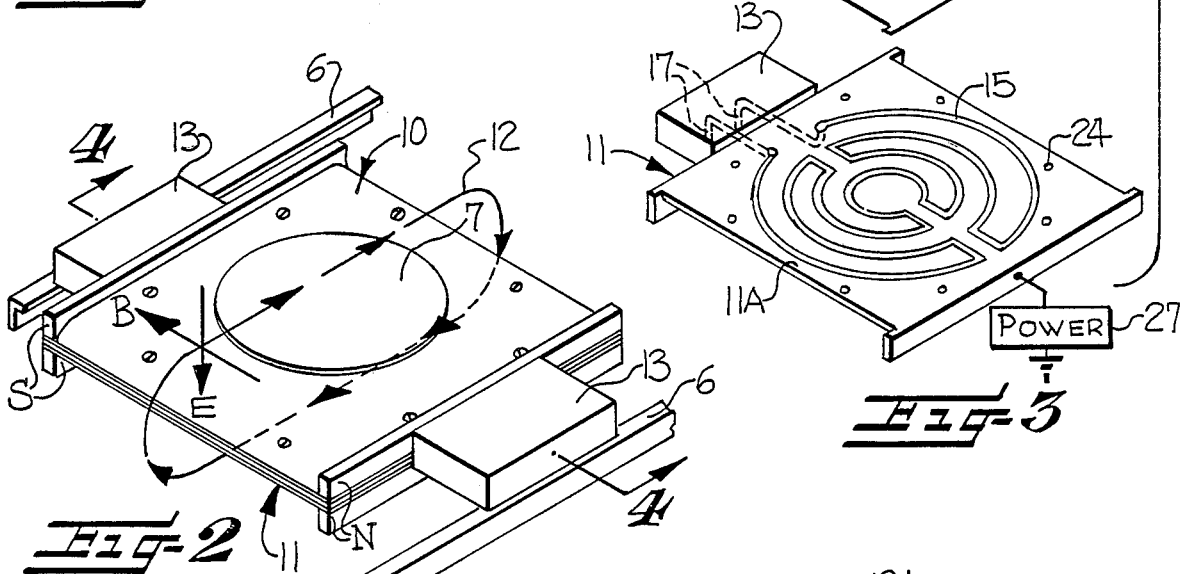
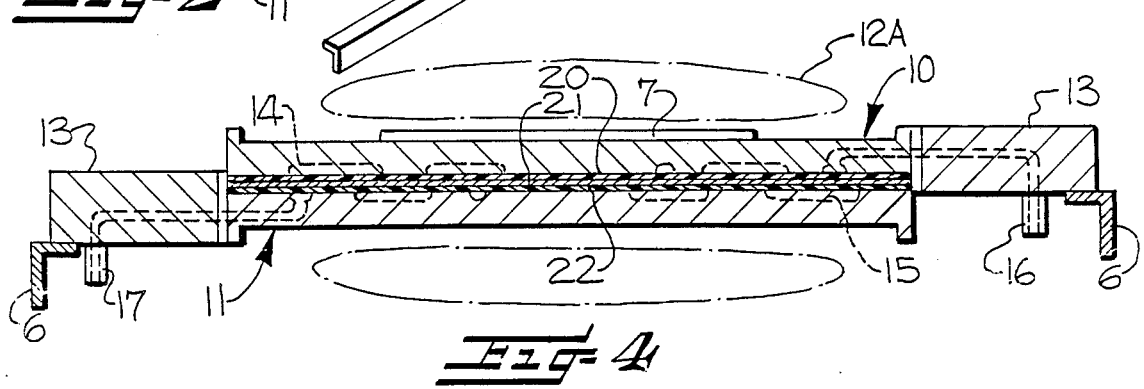

SHARED CURRENT LOOP, MULTIPLE FIELD APPARATUS AND PROCESS FOR PLASMA PROCESSING

FIELD OF THE INVENTION

The present invention relates to apparatus and process for gas discharge or plasma processing, as used for processing semiconductor wafers and manufacturing integrated circuits. More particularly, this invention relates to a multi-part cathode associated with an electron current loop and multiple, independent electric fields, with the result that the etch rates are high at low ion energy.

BACKGROUND OF THE INVENTION

Gas discharge plasma processing has become widely used to process integrated circuits, and has certain characteristics that render it superior to traditional etching techniques. Etching is a technique by which openings in a developed resist mask are transferred into the permanent layers of an integrated circuit substrate. The earlier technique of chemical wet etching has become widely supplanted by gas discharge plasma etching, especially for precision applications. The reason for this replacement is that chemical wet etching is a nondirectional (isotropic) process which etches, not just vertically into the substrate, but also laterally under the photoresist mask to create an unwanted undercutting effect in the permanent layers of the integrated circuit substrate. For example, if the substrate under a photoresist opening is etched to a depth of one micron, this undercutting adds one micron to each side of the transferred profile. This enlargement, a factor of three for a one micron wide opening, is too large and unacceptable for the current micron and submicron technology.

In contrast, plasma etching uses ions in a gas discharge to transfer the resist pattern directionally (anisotropically) into the substrate. As a result, the undercutting effect is zero and there is no unwanted enlargement of the etched pattern. Because of this advantage, gas discharge plasma etching processes have become commonplace, especially where dimensions, profile considerations, and shaping are critical.

In a simple plasma etching process, a flow of low pressure gas is admitted to a vacuum containment chamber and subjected to a radio frequency excitation. The radio frequency excitation is provided by an electrode that is housed within the vacuum containment chamber and is connected to a radio frequency power source for generating an electrical field. Electron impact with the gas molecules produces a plasma which contains ions, a larger number of reactive neutral (radical) species, and more electrons to sustain the discharge. When exposed to the plasma generated by this electrode, the wafer is bombarded by ions which strike perpendicular to its surface.

High rate etching is such conventional reactors invariably necessitates high power excitation; which may be radio frequency power, resulting in typical ion energies of 400 electron volts (eV). From a microscopic point of view, an ion impacts the etching surface at many hundreds of electron volts and, by collision cascade, spreads a large share of its energy far too deeply to be efficiently utilized for etching at the surface. The excess energy is dissipated by generating heat which may destroy the resist and produce damage in the substrate. The problem is aggravated if a higher etching rate is required, because increasing power to the electrode increases not only the etch rate but also the energy of the incident ions. Thus, there is a major lack of proportion between the energy of the ions, which is often several hundred eV, and the required chemical activation energy of the item being processed, which is typically less than 0.2 eV.

The magnetron principle may be used to reduce the ion energy to the 100–200 eV range at high power and low pressure. Systems making use of this principle are disclosed in U.S. Pat. Nos. 4,581,118, 4,525,262, and 4,442,896. The multiple field magnetron herein disclosed further reduces the ion energy to the 3 eV to 70 eV range.

Accordingly, it is an object of the present invention to provide a method and apparatus for magnetron gas discharge processing utilizing multiple, independent electric fields.

It is a further object of the present invention to provide a method and apparatus for magnetron gas discharge processing that generates, using a multi-part cathode, multiple independent electric fields around the cathode.

It is a further object of the present invention to provide a method and apparatus for magnetron gas discharge processing that increases the ion flux density for a high etch rate while reducing the ion energy to minimize damage and heat generation.

It is a further object of the present invention to provide a method and apparatus for magnetron gas discharge processing that increases the ion flux density while independently controlling ion energy.

It is a further object of the present invention to provide a method and apparatus for magnetron gas discharge processing that achieves a high etching rate at low pressure while reducing the ion energy.

These and further objects of the invention, as will become apparent from the detailed description, are accomplished with the present invention.

SUMMARY OF THE INVENTION

The present invention is a method and apparatus for magnetron gas discharge processing in which at least one current loop is formed. A multi-part cathode is associated with a current loop for generating multiple, independent electric fields. The cathode includes a first portion for generating a first electric field forming a gas discharge including ions and a second cathode portion for generating a second, independent electric field. The field generated by the second cathode extracts ions from the gas discharge, and may also control the energy with which they strike an item to be processed. The first and second cathodes are connected to first and second power sources.

BRIEF DESCRIPTION OF THE DRAWINGS

FIG. 1 is a front perspective view of a magnetron gas discharge processing apparatus of the present invention, including a multi-part cathode disposed within an evacuable chamber.

FIG. 2 is a front perspective view of the multi-part cathode shown in FIG. 1.

FIG. 3 is an exploded view of the multi-part cathode shown in FIG. 1.

FIG. 4 is a cross-sectional view of the multi-part cathode taken substantially along line 4—4 of FIG. 2.

DESCRIPTION OF THE INVENTION

Figure 5:
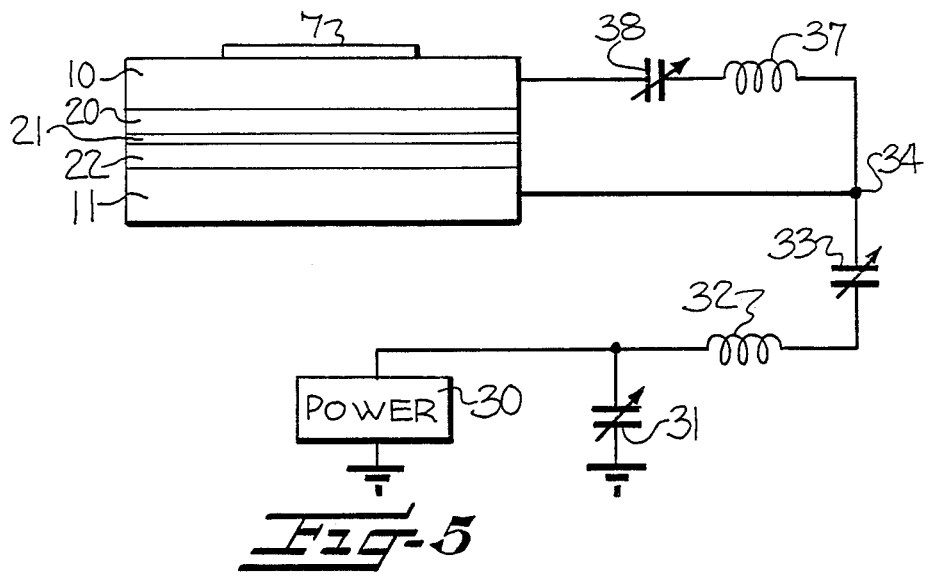
FIG. 5 is a schematic drawing of a circuit for powering the multi-part cathode.

FIG. 1 is a front perspective view of a gas discharge or plasma processing apparatus incorporating the multi-part cathode of the present invention. A conventional, gas tight containment chamber 1 is shown in phantom lines. It includes an inlet port 2 that is connected to a source of low pressure reactant gas. An outlet port, not shown, is connected to a vacuum pump to withdraw the gas from the chamber. One or more diagnostic ports or access doors 3 may also be included. A multi-part cathode assembly 5 is disposed within the chamber. Although other embodiments may be used, in the illustrated embodiments the cathode assembly is mechanically rigid and is supported on, but electrically insulated from, a pair of spaced side frames 6 within the chamber so that the gas may move therearound. A semiconductor wafer 7 or other item to be processed is supported by or rests upon the top of the cathode assembly.

Referring to FIGS. 2–4, the cathode assembly 5 is split into first (lower) and second (upper) cathode portions 11, 10, respectively, that are electrically insulated from each other. The two cathode portions are generally planar and parallel and made of a conductive material, such as aluminum. They may be coated with an insulating material, such as aluminum oxide, $Al_2O_3$. The opposite ends of each portion can be rounded, so that when assembled they present an aerodynamically smooth surface for movement of the electron flux, as shown by the arrow 12. A support block 13 is attached to one side of each cathode portion. It is typically made of Teflon material and provides mechanical support and electrical insulation.

For additional wafer and electrode cooling, the inner surface 10A, 11A of each cathode portion may contain a circuitous or serpentine cooling channel 14, 15 formed therein to cover substantially all of the inner surface area of the cathode. The cooling channels are connected through support blocks 13 to respective inlet and outlet tubes 16, 17 for connection to a cooling system, not shown.

The first and second cathode portions are separated so that each may generate an electric field independent of the other. When separated by a dielectric the material sandwiched between the cathode portions may be, for example, a dielectric, or a layered combination of conductive and dielectric materials, such as sheets of Teflon material 20, aluminum 21, and Teflon material 22. This assembly of cathode portions and dielectric material is fastened together in a conventional manner using electrically insulating fasteners that extend through the aligned apertures 24. The spacing between the first and second cathode portions may be varied as necessary or desirable to optimize the electrical decoupling of the two cathode portions. Similarly, the shape and size of the cathode portions may also be varied, as described later. As another alternative, the cathode portions may be separated by an unfilled space that is occupied by the gas within the chamber. However, the portions must be separated by a distance equal to or less than two dark spaces of plasma.

The first cathode portion is connected to a first power source 27 and the second cathode portion may be connected to a second power source 26. Alternatively, a single power source may be used, as shown in FIG. 5, provided each cathode portion may be independently operated or controlled. In FIG. 5, a single power source 30 is connected to a parallel variable capacitor 31, and a series inductor 32 and second variable capacitor 33, which terminates at circuit point 34. The first or lower cathode portion 11 is connected to circuit point 34, and the second or upper cathode portion 10 is connected to circuit point 34 through a series inductor 37 and variable capacitor 38. The power source(s) may provide radio frequency power, low frequency power, direct current power, or pulsating direct current power, as necessary or desirable. To assist in maintaining the proper electrical relation between the upper and lower cathode portions, a balancing or other electric network may be used.

Means for generating a magnetic field is placed either outside or inside the containment chamber to shape and contain the plasma loop. For example, electromagnets or permanent magnets S, N are disposed on opposite sides of the two part cathode and form a magnetic field generally parallel to the outer surfaces of the cathode, and likewise, parallel to the surface of the wafer 7 or other item to be processed that is supported by the cathode. Referring to FIG. 2, the north and south magnetic pole pieces produce a magnetic field $\overline{B}$ above the wafer surface extending from north to south. The bias voltage which results from powering the cathode during plasma operation produces an electric field $\overline{E}$ which extends perpendicularly downward into the upper cathode surface. The combination of the electric and magnetic fields results in an electron drift velocity in the general direction $\overline{v}$ which is parallel to the cathode surface. Since the electrons may move completely around the cathode surface, a large electron current loop or band 12 is formed. This loop is generally as wide as the cathode and creates a high ion density and large electron current around the cathode. The magnetic field also limits electron mobility to the cathode, with the result that the magnitude of the negative self-bias voltages of the cathode is low.

In operation, the lower cathode portion 11 of the present invention is biased with a high power radio frequency generator. As a source electrode it generates an electric field forming a gas discharge and a current loop, generally illustrated at 12A in FIG. 4. Electrons injected into this current loop create a high ion density which forms a band around the entire cathode, thus occupying the space above the upper or wafer supporting cathode portion 10.

The upper cathode portion 10, electrically isolated from the lower cathode portion, may be independently powered, and ions may be extracted from the current loop 12A at predetermined voltages. The voltage difference between the upper cathode portion and current loop 12A may be made small and is typically less than 20 volts.

The energy used to extract ions to the wafer by the upper cathode portion from the electron current loop is typically much lower than the energy of the source. For example, in one instance 900 watts of radio frequency power was supplied to the lower cathode portion, which corresponded to a power density of 2.0 watts/square centimeter with a source bias of minus 130 volts. Minimum power was applied to the upper cathode portion so that it was biased at floating potential; that is, at a slightly negative voltage relative to the plasma discharge. Under the assumption that the floating potential leads to ion energies of approximately 20 eV and that the ion current at both cathode portions is the same, the power density at the upper or wafer cathode portion is calculated to be 0.27 watts/square centimeter. Under these conditions, an oxygen etch of polymeric material was conducted. The experiment was conducted with a tri-layer photoresist. The first of the three layers was a positive resist, patterned in the conventional way. The intermediate layer was a proprietary silicon containing polymer IC-1 200 from the Futurrex Corporation, 40–50 Clinton Street, Newton, N.J. 07860, through which a resist pattern was transferred with a brief $SF_6$ plasma etching. The bottom layer was a thick planarizing organic polymer, PC-1 1500D, also from Futurrex Corporation, and it was this material that was subjected to the high rate magnetron etching. At approximately the same power density (0.27 watts/square centimeter), but with much lower ion energy (about 20 eV, or about 1/30th of the standard reactive ion etch energy), the etch rate on the bottom layer material was approximately 18 times that of a conventional reactive ion etch apparatus. The wafer also remained cool during the process even though it was not clamped to the water cooled upper cathode portion. In addition, the etch profile was anisotropic, there being very little undercut of the mask provided by the intermediate layer.

Figure 6:
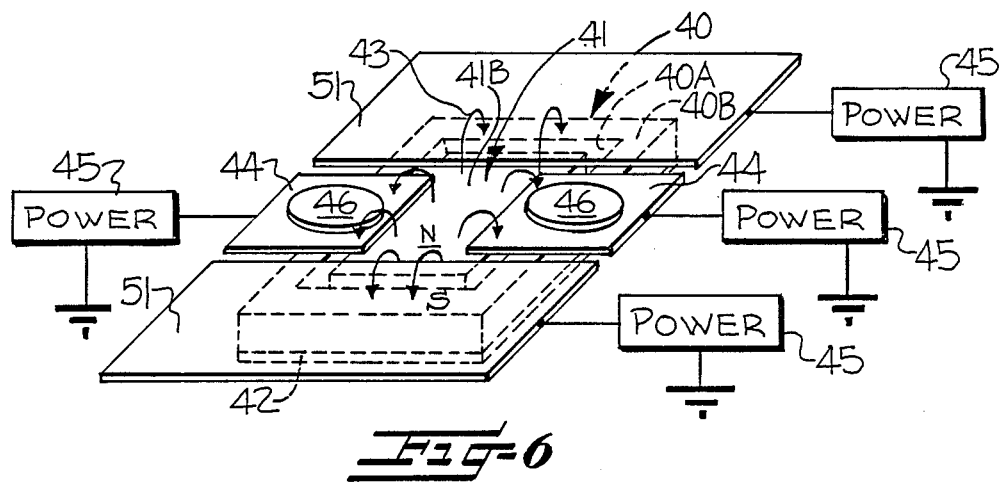
FIG. 6 is an alternate embodiment of the multi-part cathode.

FIG. 6 illustrates an alternate embodiment of the present invention. The multi-part cathode comprises first and second cathode portions, and each portion may be made up of multiple segments.

The magnetic structure of this alternate embodiment is shown in FIG. 6. A generally rectangular outer segment 40 defines a centrally located opening 40A, and another generally rectangular inner segment 41 that is complementary to the centrally located opening is disposed therein. The upper surfaces 40B, 41B of each are generally coplanar. These two first cathode segments 40 form opposite magnetic poles N,S, with the magnetic circuit including a magnetically permeable means 42, such as a plate supporting the segments, and an air gap. The air gap is illustrated with arrows 43 representing the lines of magnetic flux.

The first cathode portion may comprise more than one segment, two such segments 51 are shown in FIG. 6. The second cathode portion may also comprise more than one segment, each separated from the first cathode portion so that each may generate an electric field independent of the electric field of the first cathode portion, and each other, if so desired. In this embodiment the second cathode portion comprises individual plates 44 separated from the first cathode portion yet disposed proximate the air gap 43. Each segment of each portion may be connected to a separate power supply 45, which together comprise the power supply for the cathode portions. Alternatively, a single power supply may be used with the cathode portions or may be connected through electrical networks, such as described earlier.

The wafer or item to be processed 46 is supported by or rests upon the upper surface of one or more of the upper or second cathode portions 44.

Figure 7:
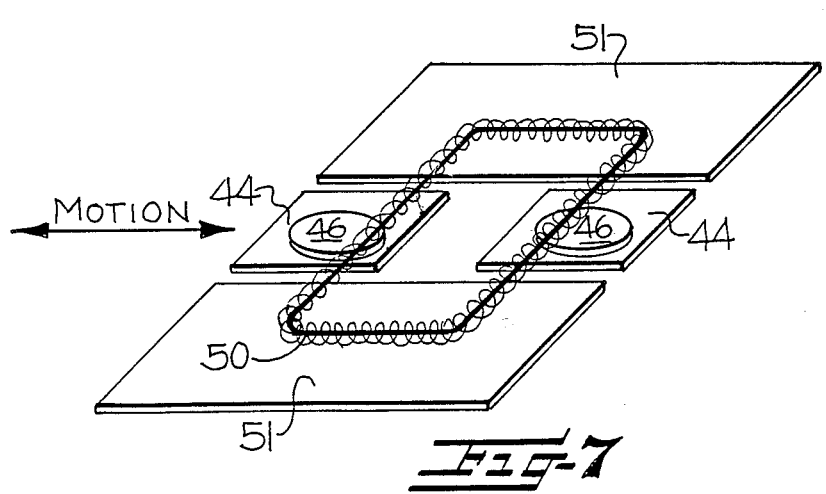
FIG. 7 is a schematic drawing of the operation of the alternate embodiment of FIG. 6.

The operation of this embodiment is the same as the first embodiment, and is illustrated in FIG. 7. The gas discharge region and current loop 50 are formed by the electric field generated by the first cathode portions 51. It is generally planar and above the surface defined by the segments of the first cathode portion. More specifically, the current loop is formed in the space generally defined by the magnetic flux in the air gap 43. Ions are extracted from the current loop 50 and attracted to the item to be processed by the independent electric field generated by the second cathode portion 44, or each of them, as desired.

Mechanical motion as shown by the arrow in FIG. 7 may be applied to the second cathode portions 44 and the items to be processed 46 in order to realize process uniformity.

Many modifications and other embodiments of the subject invention will readily come to one skilled in the art having the benefit of the teachings presented in the foregoing descriptions and the associated drawings. Therefore, it is to be understood that the invention is not to be limited to the specific embodiment disclosed, and that modifications and embodiments are intended to be included within the scope of the appended claims.

What is claimed is:

1. A magnetron gas discharge processing apparatus comprising:
    an evacuable chamber for containing a reactant gas therein;
    means for generating a magnetic field within the evacuable chamber;
    multi-part cathode means for forming at least one closed electron current loop within said chamber, said multi-part cathode means being disposed within the chamber and comprising
    a first cathode portion means for forming a plasma gas discharge including ions and generating a first electric field that interacts with the magnetic field to produce an a closed electron current loop, the first cathode portion means being connected to a first power source, and
    a second cathode portion means associated with the same electron current loop for generating a second, independent electric field that interacts with the gas discharge and for extracting ions from the gas discharge to strike an item to be processed, the second cathode portion means being connected to a second power source.

2. The apparatus of claim 1 wherein the first and second cathode portions of the multi-part cathode means are at least partially disposed within the closed current loop.

3. The apparatus of claim 1 wherein the first and second cathode portions of the multi-part cathode means are disposed adjacent to the closed current loop.

4. The apparatus of claim 1 wherein the first cathode portion means comprises multiple segments, with at least one of the segments being connected to the first power source.

5. The apparatus of claim 1 wherein the first cathode portion means comprises multiple segments, with each segment being connected to the first power source.

6. The apparatus of claim 1 wherein the second cathode portion means comprises means for supporting an item to be processed.

7. The apparatus of claim 1 wherein the second cathode portion means comprises multiple segments, with at least one of the segments being connected to the second power source.

8. The apparatus of claim 1 wherein the second cathode portion means comprises multiple segments, with each segment being connected to the second power source.

9. The apparatus of claim 1 wherein the means for generating a magnetic field comprises means for generating a magnetic field forming a loop around the multi-part cathode.

10. The apparatus of claim 1 wherein the means for generating a magnetic field comprises magnetic poles forming a magnetic field generally parallel to the surface of an item to be processed.

11. The apparatus of claim 1 wherein the means for generating a magnetic field comprises at least one pair of opposite polarity magnetic poles spaced apart from each other on opposite sides of the second cathode for forming a magnetic field across an item to be processed.

12. The apparatus of claim 1 wherein the second cathode portion means also comprises means for controlling the energy with which the extracted ions strike an item to be processed.

13. The apparatus of claim 1 wherein the first and second cathode portion means are generally planar.

14. The apparatus of claim 1 wherein the first and second cathode portion means are generally parallel.

15. The apparatus of claim 1 wherein the first and second cathode portion means are separated by a dielectric.

16. The apparatus of claim 1 wherein the multi-part cathode further includes channels for circulation of a cooling medium to withdraw excess heat therefrom.

17. The apparatus of claim 1 wherein the first and second cathode portion means comprise generally planar, electrically conductive plates fixed in parallel, spaced relation.

18. The apparatus of claim 1 wherein the first and second cathode portion means are separated from each other by space, the width of the space being equal to or less than two dark spaces of plasma.

19. The apparatus of claim 1 wherein the first and second cathode portion means are electrically coupled.

20. The apparatus of claim 1 wherein the first power source comprises a power source selected from the: radio frequency power source, direct current power source, or pulsating direct current power source.

21. The apparatus of claim 1 wherein the second power source comprises a power source selected from radio frequency power source, direct current power source, or pulsating direct current power source.

22. The apparatus of claim 1 wherein the multi-part cathode means comprises means for generating at least one electric field that is generally perpendicular to the generated magnetic field.

23. A multi-part cathode for use in a plasma gas discharge processing apparatus, the multi-part cathode comprising:
means for generating a magnetic field associated with the multi-part cathode
a first cathode portion means for forming a gas discharge including ions and generating a first electric field that interacts with the magnetic field to produce a closed electron current loop, the first cathode portion means being connected to a first power source, and
a second cathode portion means associated with the same current loop for generating a second, independent electric field that interacts with the gas discharge and for extracting ions from the gas discharge to strike an item to be processed, the second cathode portion means being connected to a second power source.

24. The apparatus of claim 23 wherein the multi-part cathode means is at least partially disposed within the current loop.

25. The apparatus of claim 23 wherein the multipart cathode means is disposed below the current loop.

26. The apparatus of claim 23 wherein the first cathode portion means comprises multiple segments, with at least one of the segments being connected to the first power source.

27. The apparatus of claim 23 wherein the first cathode portion means comprises multiple segments, with each segment being connected to the first power source.

28. The apparatus of claim 23 wherein the second cathode portion means comprises means for supporting an item to be processed.

29. The apparatus of claim 23 wherein the second cathode portion means comprises multiple segments, with at least one of the segments being connected to the second power source.

30. The apparatus of claim 23 wherein the second cathode portion means comprises multiple segments, with each segment being connected to the second power source.

31. The apparatus of claim 23 wherein the second cathode portion means also controls the energy with which the extracted ions strike an item to be processed.

32. A method of magnetron gas discharge processing an item within an evacuable chamber containing a reactant gas and a multi-part cathode, the method comprising
generating a magnetic field within the evacuable chamber;
forming a plasma gas discharge including ions within the chamber and generating a first electric field that interacts with the magnetic field by energizing a first portion of a multi-part cathode to produce a closed electron current loop; and
extracting ions from the formed plasma gas discharge toward the item being processed by energizing a second portion of the multi-part cathode associated with the closed current loop to generate a second, independent electric field that interacts with the plasma gas discharge.

33. The method of claim 32 the step of extracting ions further comprises controlling the energy of the second electric field so as to control the energy with which the extracted ions strike the item being processed.

34. The method of claim 32 wherein the step of forming an electron current loop and plasma gas discharge comprises forming an electron current loop and associated plasma gas discharge around the multi-part cathode.

35. The method of claim 32 wherein
the step of forming an electron current loop and plasma gas discharge comprises energizing a first portion of the multi-part cathode with a first power source and the step of extracting ions comprises energizing a second portion of the multi-part cathode with a second power source.

36. The method of claim 32 wherein the step of extracting ions comprises energizing a second portion of the multi-part cathode that is separated from the first cathode portion by a dielectric.

37. The method of claim 32 further including the preliminary steps of evacuating a chamber containing a multi-part cathode and introducing a reactant gas mixture into the chamber.

38. The method of claim 32 wherein the step of generating a magnetic field comprises generating a magnetic field forming a loop around the multi-part cathode.

39. The method of claim 32 further including the step of circulating a cooling medium through the multi-part cathode to withdraw excess heat.

40. The method of claim 32 wherein the step of generating a first electric field comprises generating a first electric field that is generally perpendicular to the generated magnetic field.

* * * * *

UNITED STATES PATENT AND TRADEMARK OFFICE
CERTIFICATE OF CORRECTION

PATENT NO. : 4,738,761

DATED : Apr. 19, 1988

INVENTOR(S) : Stephen M. Bobbio et al

It is certified that error appears in the above-identified patent and that said Letters Patent is hereby corrected as shown below:

Column 2, line 13, change "4,442,896" to -- 4,422,896 --.

Column 3, line 20, change "embodiments" to -- embodiment --.

Column 6, line 34, delete "an".

Column 7, line 39, omit "the:".

Signed and Sealed this

Twentieth Day of September, 1988

*Attest:*

DONALD J. QUIGG

*Attesting Officer*    *Commissioner of Patents and Trademarks*